United States Patent
Hook et al.

(10) Patent No.: US 9,997,539 B2
(45) Date of Patent: Jun. 12, 2018

(54) FULLY-DEPLETED SILICON-ON-INSULATOR TRANSISTORS

(71) Applicants: INTERNATIONAL BUSINESS MACHINES CORPORATION, Armonk, NY (US); Horacio Mendez, Austin, TX (US)

(72) Inventors: Terence B. Hook, Jericho, VT (US); Horacio Mendez, Austin, TX (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/251,222

(22) Filed: Aug. 30, 2016

(65) Prior Publication Data

US 2016/0372485 A1   Dec. 22, 2016

Related U.S. Application Data

(63) Continuation of application No. 14/487,421, filed on Sep. 16, 2014, now Pat. No. 9,484,270.

(51) Int. Cl.
| | |
|---|---|
| *H01L 27/12* | (2006.01) |
| *H01L 21/84* | (2006.01) |
| *H01L 27/092* | (2006.01) |
| *H01L 21/326* | (2006.01) |
| *H01L 21/8234* | (2006.01) |
| *H01L 29/36* | (2006.01) |

(Continued)

(52) U.S. Cl.
CPC ...... *H01L 27/1203* (2013.01); *H01L 21/2652* (2013.01); *H01L 21/326* (2013.01); *H01L 21/823493* (2013.01); *H01L 21/823807* (2013.01); *H01L 21/84* (2013.01); *H01L 27/092* (2013.01); *H01L 27/0922* (2013.01); *H01L 27/0925* (2013.01); *H01L 29/0649* (2013.01); *H01L 29/36* (2013.01)

(58) Field of Classification Search
CPC ............ H01L 27/1203; H01L 21/2652; H01L 21/326; H01L 21/823493; H01L 21/823807; H01L 21/84; H01L 27/092; H01L 27/0922; H01L 27/0925; H01L 27/0649; H01L 29/36
USPC .......................................... 257/348, E27.062
See application file for complete search history.

(56) References Cited

U.S. PATENT DOCUMENTS

| | | |
|---|---|---|
| 6,342,717 B1 | 1/2002 | Komatsu |
| 6,855,989 B1 | 2/2005 | Wang et al. |

(Continued)

OTHER PUBLICATIONS

Anonymous Disclosure, "Multiple WF/Doping Vt FET Technology for Low Power", IP.com, IPCOM000223725D, Nov. 26, 2012; 2 Pages.

(Continued)

*Primary Examiner* — Dzung Tran (74) *Attorney, Agent, or Firm* — Steven Meyers; Andrew M. Calderon; Roberts Mlotkowski Safran Cole & Calderon, P.C.

(57) ABSTRACT

A fully-depleted silicon-on-insulator (FDSOI) semiconductor structure includes: a first PFET, a second PFET, and a third PFET each having a different threshold voltage and each being over an n-well that is biased to a first voltage; and a first NFET, a second NFET, and a third NFET each having a different threshold voltage and each being over a p-type substrate that is biased to a second voltage. The second voltage is different than the first voltage.

19 Claims, 6 Drawing Sheets

(51) Int. Cl.
*H01L 29/06* (2006.01)
*H01L 21/8238* (2006.01)
*H01L 21/265* (2006.01)

(56) References Cited

U.S. PATENT DOCUMENTS

| | | | |
|---|---|---|---|
| 6,867,433 B2 | 3/2005 | Yeo et al. | |
| 7,939,393 B2 | 5/2011 | Xiong et al. | |
| 8,482,070 B1 | 7/2013 | Flatresse et al. | |
| 8,513,106 B2 | 8/2013 | Hook | |
| 8,530,974 B2 | 9/2013 | Cheng et al. | |
| 8,552,500 B2 | 10/2013 | Dennard et al. | |
| 2002/0089012 A1 | 7/2002 | Nomoto et al. | |
| 2007/0029620 A1 | 2/2007 | Nowak | |
| 2007/0178639 A1* | 8/2007 | Cecchi | H01L 27/0921 438/227 |
| 2008/0116939 A1* | 5/2008 | Takizawa | H01L 21/84 326/103 |
| 2009/0003105 A1 | 1/2009 | Itoh et al. | |
| 2009/0160531 A1 | 6/2009 | Law et al. | |
| 2009/0212362 A1* | 8/2009 | Cheng | H01L 21/84 257/347 |
| 2009/0253253 A1 | 10/2009 | Xiong et al. | |
| 2010/0117122 A1 | 5/2010 | Benoit et al. | |
| 2010/0258872 A1 | 10/2010 | Sugii et al. | |
| 2012/0146147 A1 | 6/2012 | Hook | |
| 2012/0175712 A1 | 7/2012 | Chang et al. | |
| 2012/0299080 A1 | 11/2012 | Dennard et al. | |
| 2012/0299105 A1 | 11/2012 | Cai et al. | |
| 2013/0178043 A1* | 7/2013 | Cheng | H01L 21/84 438/400 |
| 2016/0079127 A1 | 3/2016 | Hook et al. | |

OTHER PUBLICATIONS

Majumdar et al., "Undoped-Body Extremely Thin SOI MOSFETs with Back Gates", IEEE Transactions on Electron Devices, vol. 56, No. 10, Oct. 2009, pp. 2270-2276.

Noel et al., "Multi-VT UTBB FDSOI Device Architectures for Low-Power CMOS Circuit", IEEE Transactions on Electron Devices, vol. 58, No. 8, Aug. 2011, pp. 2473-2482.

List of IBM Patents or Patent Applications Treated as Related, 1 page.

Specification "Fully-Depleted Silicon-On-Insulator Transistors" and Drawings in U.S. Appl. No. 15/953,960 filed Apr. 16, 2018, 25 pages.

* cited by examiner

FULLY-DEPLETED SILICON-ON-INSULATOR TRANSISTORS

FIELD OF THE INVENTION

The invention relates to semiconductor devices and, more particularly, to fully-depleted silicon-on-insulator (FDSOI) transistors and methods of manufacture.

BACKGROUND

Complementary metal-oxide semiconductor (CMOS) field-effect transistors (FETs) are employed in almost every electronic circuit application, such as signal processing, computing, and wireless communications. Scaling down the gate length of both n-channel FETs (NFETs) and p-channel FETs (PFETs) in CMOS circuits to shorter dimensions can increase the speed of the CMOS circuits. However, detrimental short-channel effects can lead to high off-state leakage currents in CMOS devices, thereby increasing the power consumption. In case of extreme short-channel effects, CMOS circuits fail to operate.

Fully-depleted semiconductor-on-insulator (FDSOI) FETs offer advantages over conventional bulk transistors. However, FDSOI FETs generally require more complex processing such as high-k dielectric material gates. FDSOI FETs also generally include disruptive design elements such as unique well biases.

SUMMARY

In an aspect of the invention, there is a fully-depleted silicon-on-insulator (FDSOI) semiconductor structure comprising: a first PFET, a second PFET, and a third PFET each having a different threshold voltage and each being over an n-well that is biased to a first voltage; and a first NFET, a second NFET, and a third NFET each having a different threshold voltage and each being over a p-type substrate that is biased to a second voltage. The second voltage is different than the first voltage.

In another aspect of the invention, there is a semiconductor structure comprising: a substrate; a well in the substrate and biased differently than the substrate; a buried oxide (BOX) layer on the substrate; a first PFET having a first threshold voltage; a second PFET having a second threshold voltage less than the first threshold voltage; a third PFET having a third threshold voltage less than the second threshold voltage; a first NFET having a fourth threshold voltage; a second NFET having a fifth threshold voltage less than the fourth threshold voltage; and a third NFET having a sixth threshold voltage less than the fifth threshold voltage. The first PFET, the second PFET, and the third PFET are on the BOX layer and over the well. The first NFET, the second NFET, and the third NFET are on the BOX layer and over substrate.

In another aspect of the invention, there is a method of manufacturing a semiconductor structure, comprising: forming a well in a substrate; forming a first PFET, a second PFET, and a third PFET on a buried oxide (BOX) layer and over the well; forming a first NFET, a second NFET, and a third NFET on the BOX layer and over the substrate; biasing the well to a first voltage; and biasing the substrate to a second voltage different than the first voltage. The first PFET, the second PFET, and the third PFET each has a different threshold voltage. The first NFET, the second NFET, and the third NFET each has a different threshold voltage.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor devices and, more particularly, to fully-depleted silicon-on-insulator (FDSOI) transistors and methods of manufacture. According to aspects of the invention, a plurality of p-type FDSOI FETs are formed on an n-well that is biased to VDD, and a plurality of n-type FDSOI FETs are formed on a p-type substrate that is biased to ground. In embodiments, the plurality of p-type FDSOI FETs and the plurality of n-type FDSOI FETs each include a high threshold voltage (HVT) transistor, a regular threshold voltage (RVT) transistor with a back gate, and a low threshold voltage (LVT) transistor. With the n-well set at VDD and the substrate set at ground, aspects of the invention include tailoring the doping of the transistor bodies and the thickness of the buried oxide (BOX) layer to achieve desired threshold voltages of the HVT, RVT, and LVT devices.

According to aspects of the invention, FDSOI transistors suitable for seamless adaptation from standard bulk designs are formed by providing doping and structures commensurate with the appropriate threshold voltage(s) when the well beneath the NFETs is grounded, and the well beneath the PFETs is at the power supply voltage, as in conventional bulk designs. A multiplicity of transistors is provided by a combination of well doping, BOX thickness, and body doping, in proper conjunction with the gate work functions. The operation of the invention is also consistent with doped polysilicon on oxide (nitrided or otherwise) dielectric.

The structures of the present invention can be manufactured in a number of ways using a number of different tools. In general, though, the methodologies and tools are used to form structures with dimensions in the micrometer and nanometer scale. The methodologies, i.e., technologies, employed to manufacture the structures of the present invention have been adopted from integrated circuit (IC) technology. For example, the structures of the present invention are built on wafers and are realized in films of material patterned by photolithographic processes on the top of a wafer. In particular, the fabrication of the structures of the present invention uses three basic building blocks: (i) deposition of thin films of material on a substrate, (ii) applying a patterned mask on top of the films by photolithographic imaging, and (iii) etching the films selectively to the mask.

Figure 1:
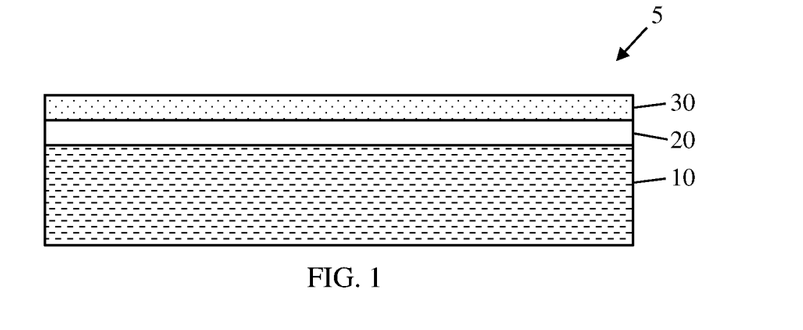
FIGS. 1, 2a, 2b, 3a, 3b, 4a, 4b, and 5a-c show semiconductor structures and respective processing steps in accordance with aspects of the invention.

FIG. 1 is a cross-sectional enlarged view of a portion of wafer 5 that includes a substrate 10, a BOX layer 20, and a semiconductor layer 30. According to aspects of the invention, the wafer is used to build FDSOI FETs and, as such, has dimensions that are consistent with extremely thin silicon on insulator (ETSOI) structures. For example, the BOX layer 20 has a thickness of about 10-50 nm, and the semiconductor layer 30 has a thickness generally less than about 10 nm and preferably about 5-6 nm; although other dimensions are also contemplated by the present invention.

The constituent materials of the wafer 5 may be selected based on the desired end use application of the semiconductor device. For example, the substrate 10 may be composed of any suitable material including, but not limited to, Si, SiGe, SiGeC, SiC, GE alloys, GaAs, InAs, InP, and other III/V or II/VI compound semiconductors. In embodiments, the substrate 10 is p-type doped silicon having a doping concentration of about $2 \times 10^{15}/cm^3$. The BOX layer 20 may be referred to simply as an insulating layer, as in some embodiments it can comprise composite layers including, for example, materials having a selected dielectric constant. In one example, the BOX layer 20 comprises oxide, such as $SiO_2$. Moreover, although the wafer 5 is referred to as "silicon on insulator," the semiconductor layer 30 is not limited to silicon. Instead, the semiconductor layer 30 may be comprised of various semiconductor materials, such as, for example, Si, SiGe, SiC, SiGeC, etc.

Figure 2A:
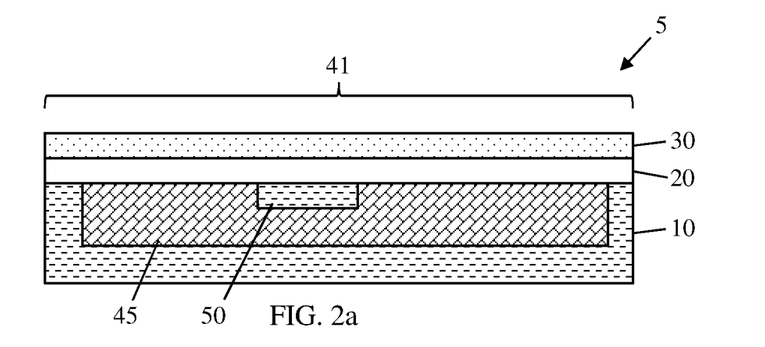
Figure 2B:
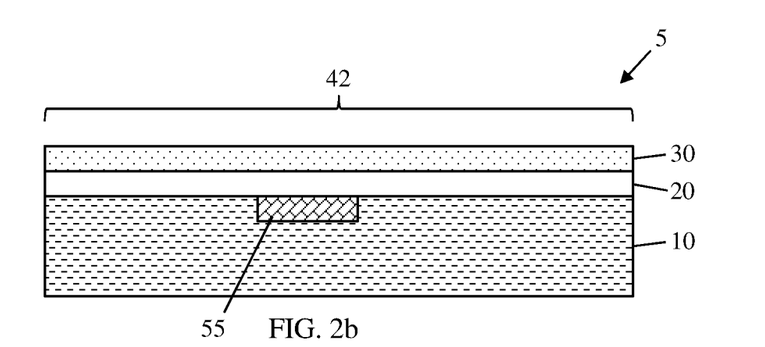

FIG. 2a shows a first area 41 of the wafer 5, and FIG. 2b shows a second area 42 of the wafer 5. As shown in FIG. 2a, an n-well 45 is formed in the p-type substrate 10 in the first area 41, and a back gate 50 is formed in the n-well 45. As shown in FIG. 2b, a back gate 55 is formed in the p-type substrate 10 in the second area 42. The doped regions of the n-well 45, back gate 50, and back gate 55 may be formed using conventional masking and ion-implant processes. For example, an ion implant process may include: applying a masking layer to a top surface of the semiconductor layer 30; forming windows or openings in the masking layer (using for example conventional lithography processes) such that the openings are aligned with the intended locations of the doped regions in the substrate 10; introducing ions using ion implantation at a selected kinetic energy and dose, such that the ions penetrate through the semiconductor layer 30 and the BOX layer 20 to reach the substrate 10; and removing the masking layer. The implant conditions, such as dose and kinetic energy, are selected to provide a projected range and a dopant concentration that defines the doped regions in the substrate 10.

In embodiments, the n-well 45 is doped with an n-type impurity (e.g., phosphorous, arsenic, or antimony) at a concentration of about concentration of about $1 \times 10^{17}/cm^3$. In embodiments, the back gate 50 is counter-doped with a p-type impurity (e.g., boron, gallium, or indium) at a concentration of about $7 \times 10^{18}/cm^3$ to about $1 \times 10^{19}/cm^3$. In embodiments, the back gate 55 is doped with an n-type impurity at a concentration of about $7 \times 10^{18}/cm^3$ to about $1 \times 10^{19}/cm^3$. The invention is not limited to these dopant concentrations, and any suitable concentrations may be used.

Figure 3A:
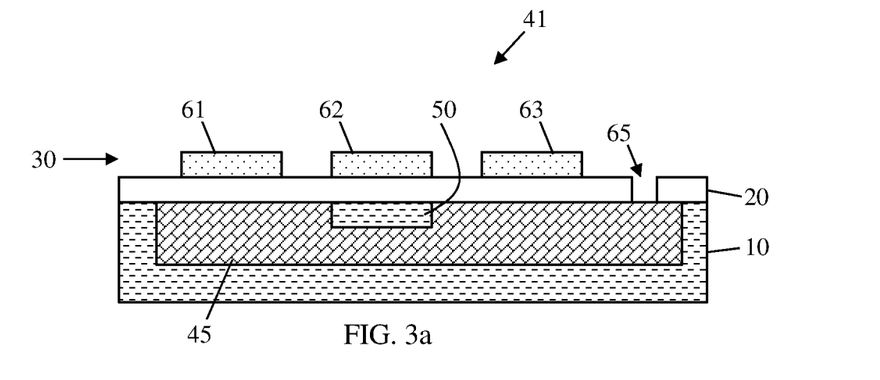

FIG. 3a shows the first area 41 after the semiconductor layer 30 is patterned into respective transistor bodies 61, 62, 63, and after an n-well contact opening 65 is formed in the BOX layer 20. The transistor bodies 61, 62, 63 may be patterned from the semiconductor layer 30 using conventional semiconductor fabrication processes such as photolithographic masking and etching. For example, the transistor bodies 61, 62, 63 may be formed by arranging a photoresist material on the semiconductor layer 30, exposing and developing the photoresist, etching portions of the semiconductor layer 30 through the patterned photoresist (e.g., using a reactive ion etch (RIE) process), and stripping the photoresist. The n-well contact opening 65 may be formed in a similar manner, e.g., using photolithographic masking and etching to remove a selected portion of the BOX layer 20 to expose a portion of the n-well 45.

In embodiments, the transistor body 62 is formed in spatial relation relative to the back gate 50 such that a central portion (e.g., a channel region) of the transistor body 62 is vertically over and aligned with a portion of the back gate 50. In this manner, the back gate 50 is structured and arranged to affect the conduction band of a channel of a FET formed on transistor body 62, as described in greater detail herein, to thereby affect the threshold voltage of the FET.

Figure 3B:
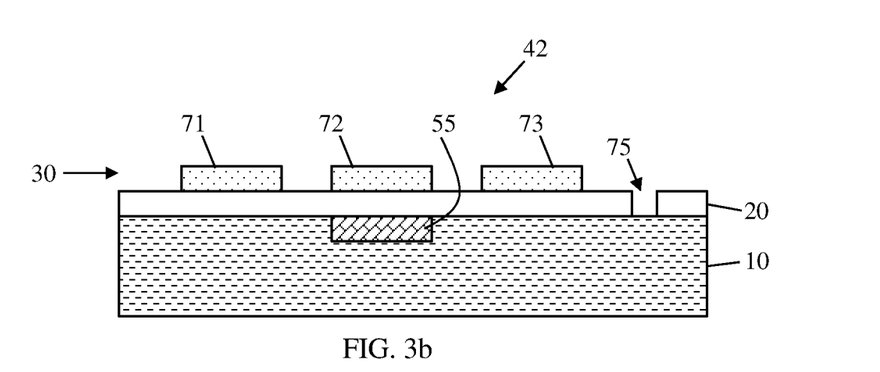

FIG. 3b shows the second area 42 after the semiconductor layer 30 is patterned into respective transistor bodies 71, 72, 73, and after a substrate contact opening 75 is formed in the BOX layer 20. The transistor bodies 71, 72, 73 may be patterned from the semiconductor layer 30 using conventional semiconductor fabrication processes such as photolithographic masking and etching. For example, the transistor bodies 71, 72, 73 may be formed by arranging a photoresist material on the semiconductor layer 30, exposing and developing the photoresist, etching portions of the semiconductor layer 30 through the patterned photoresist (e.g., using a reactive ion etch (RIE) process), and stripping the photoresist. The substrate contact opening 75 may be formed in a similar manner, e.g., using photolithographic masking and etching to remove a selected portion of the BOX layer 20 to expose a portion of the substrate 10.

In embodiments, the transistor body 72 is formed in spatial relation relative to the back gate 55 such that a central portion (e.g., a channel region) of the transistor body 72 is vertically over and aligned with a portion of the back gate 55. In this manner, the back gate 55 is structured and arranged to affect the conduction band of a channel of a FET formed on transistor body 72, as described in greater detail herein, to thereby affect the threshold voltage of the FET.

Figure 4A:
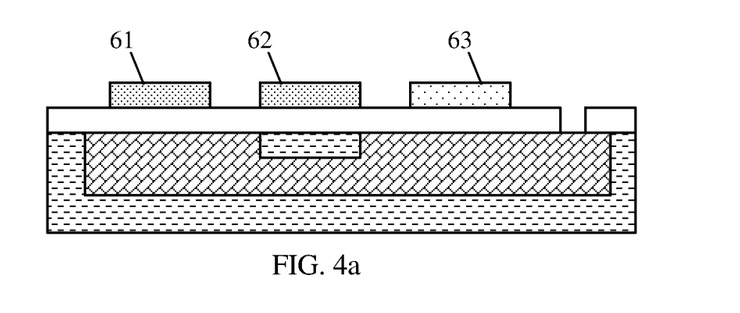
Figure 4B:
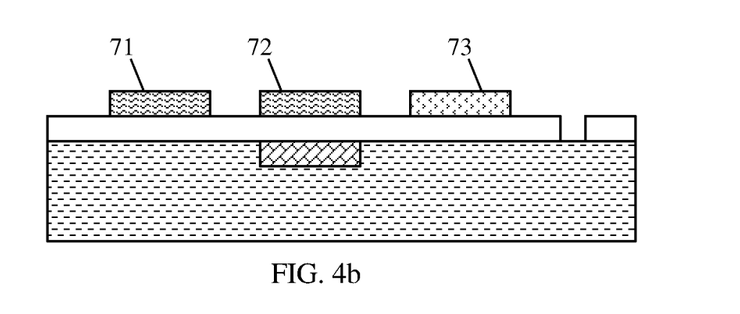

As shown in FIGS. 4a and 4b, the respective transistor bodies 61, 62, 63 are doped with p-type impurity and the respective transistor bodies 71, 72, 73 are doped with n-type impurity. According to aspects of the invention, the transistor body 61 and the transistor body 62 are doped to a first dopant concentration, and the transistor body 63 is doped to a second dopant concentration that is less than the first dopant concentration. According to aspects of the invention, the transistor body 71 and the transistor body 72 are doped to a third dopant concentration, and the transistor body 73 is doped to a fourth dopant concentration that is less than the third dopant concentration. The doping may be performed using conventional processes, such as masking and ion implantation using controlled dose and kinetic energy.

Figure 5A:
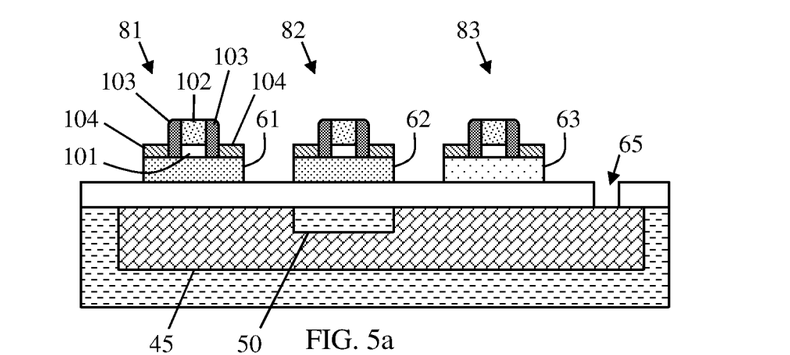
Figure 5B:
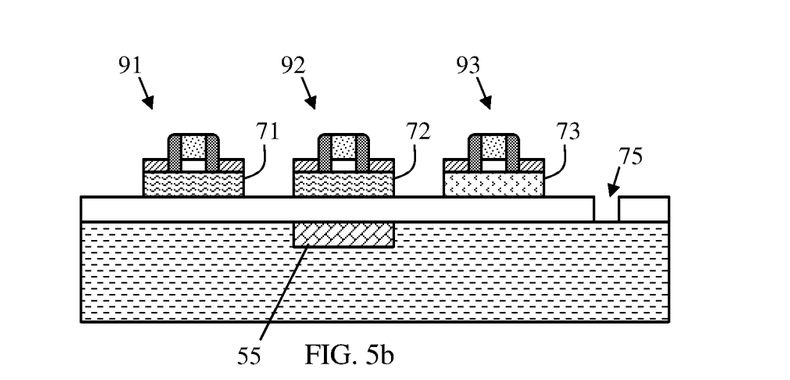

As shown in FIGS. 5a and 5b, respective FETs 81, 82, 83 are formed on the respective transistor bodies 61, 62, 63, and respective FETs 91, 92, 93 are formed on the respective transistor bodies 71, 72, 73. The FETs 81-83 and 91-93 may be formed using conventional semiconductor materials and processes. For example, as shown in FIG. 5a, representative FET 81 may include a gate dielectric 101, a gate electrode 102, spacers 103, and raised source/drain regions 104 that are formed using suitable deposition and/or sputtering, photolithography and etching steps. The gate dielectric 101 may be composed of, for example, oxide, nitride, oxynitride, high-k dielectric material, or layers thereof. The gate electrode 102 may be composed of, for example, polysilicon, metal, alloy, or layers thereof. The spacers 103 may be composed of dielectric material such as, for example, nitride. The source/drain regions 104 may be composed of, for example, polysilicon that is doped with a similar type of impurity that is used in the underlying transistor body 81. The channel of the FET 81 is thus in the transistor body 61. Silicide regions, although not shown, may be formed on the gate electrode 102 and/or the source/drain regions 104 as is understood by those of ordinary skill in the art.

Referring to FIG. 5a, in accordance with aspects of the invention, the dopant concentrations of the transistor bodies 61, 62, 63 and the back gate 50 are configured such that the FET 81 is a high threshold voltage (HVT) p-channel transistor (PFET), the FET 82 is a regular threshold voltage (RVT) p-channel transistor (PFET), and the FET 83 is a low threshold voltage (LVT) p-channel transistor (PFET). In embodiments, and as discussed with respect to FIG. 4a, the transistor bodies 61 and 62 have the same dopant concentration. The back gate 50 lowers the conduction band in the channel (i.e., the transistor body 62) of the FET 82 and, thus, lowers the threshold voltage of the FET 82 relative to the threshold voltage of the FET 81 which has the same channel dopant concentration but no back gate. In aspects, and as discussed with respect to FIG. 4a, the dopant concentration of the transistor body 63 is tailored to be sufficiently less than that of the transistor body 62, such that the FET 83 has a lower threshold voltage than the FET 82. In embodiments, the dopant concentrations of the transistor bodies 61, 62, 63 and the back gate 50 are configured such that the threshold voltage of the FET 81 is a predetermined amount (e.g., about 80 mV) greater than the threshold voltage of the FET 82, and such that the threshold voltage of the FET 82 is the predetermined amount greater than the threshold voltage of the FET 83. The invention is not limited to these exemplary values of threshold voltage difference, however, and other suitable values may be obtained by controlling the dopant concentrations of the transistor bodies 61, 62, 63 and the back gate 50.

Referring to FIG. 5b, in accordance with aspects of the invention, the dopant concentrations of the transistor bodies 71, 72, 73 and the back gate 55 are configured such that the FET 91 is a high threshold voltage (HVT) n-channel transistor (NFET), the FET 92 is a regular threshold voltage (RVT) n-channel transistor (NFET), and the FET 93 is a low threshold voltage (LVT) n-channel transistor (NFET). In embodiments, and as discussed with respect to FIG. 4b, the transistor bodies 71 and 72 have the same dopant concentration. The back gate 55 lowers the conduction band in the channel (i.e., the transistor body 72) of the FET 92 and, thus, lowers the threshold voltage of the FET 92 relative to the threshold voltage of the FET 91 which has the same channel dopant concentration but no back gate. In aspects, and as discussed with respect to FIG. 4b, the dopant concentration of the transistor body 73 is tailored to be sufficiently less than that of the transistor body 72, such that the FET 93 has a lower threshold voltage than the FET 92. In embodiments, the dopant concentrations of the transistor bodies 71, 72, 73 and the back gate 55 are configured such that the threshold voltage of the FET 91 is a predetermined amount (e.g., about 80 mV) greater than the threshold voltage of the FET 92, and such that the threshold voltage of the FET 92 is the predetermined amount greater than the threshold voltage of the FET 93. The invention is not limited to these exemplary values of threshold voltage difference, however, and other suitable values may be obtained by controlling the dopant concentrations of the transistor bodies 71, 72, 73 and the back gate 55.

Figure 5C:
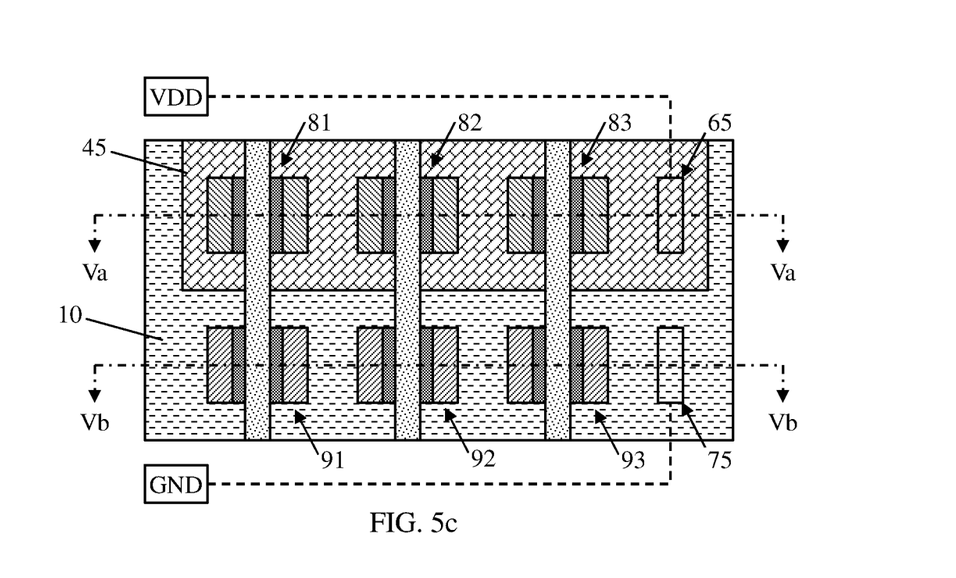

FIG. 5c shows a plan view of the wafer 5 in which line Va-Va corresponds to the cross section of FIG. 5a and line Vb-Vb corresponds to the cross section of FIG. 5b. As shown in FIGS. 5a-c, the p-channel FETs 81, 82, 83 are formed over the n-well 45 and the n-channel FETs 91, 92, 93 are formed over the p-type substrate 10. In embodiments, the n-well 45 is biased to a supply voltage VDD (e.g., 1.1 V) by electrical connection formed at the n-well contact opening 65, and the substrate 10 is biased to ground (e.g., 0 V) by electrical connection formed at the substrate contact opening 75. In this manner, the structure provides an FDSOI device that includes an HVT PFET, an RVT PFET, and an LVT PFET that are all formed in association with an n-well that is at VDD, and that also includes an HVT NFET, an RVT NFET, and an LVT NFET that are all formed in association with p-type substrate that is at ground. As depicted in FIG. 5c, certain ones of the FETs may share a common gate.

Figure 6:
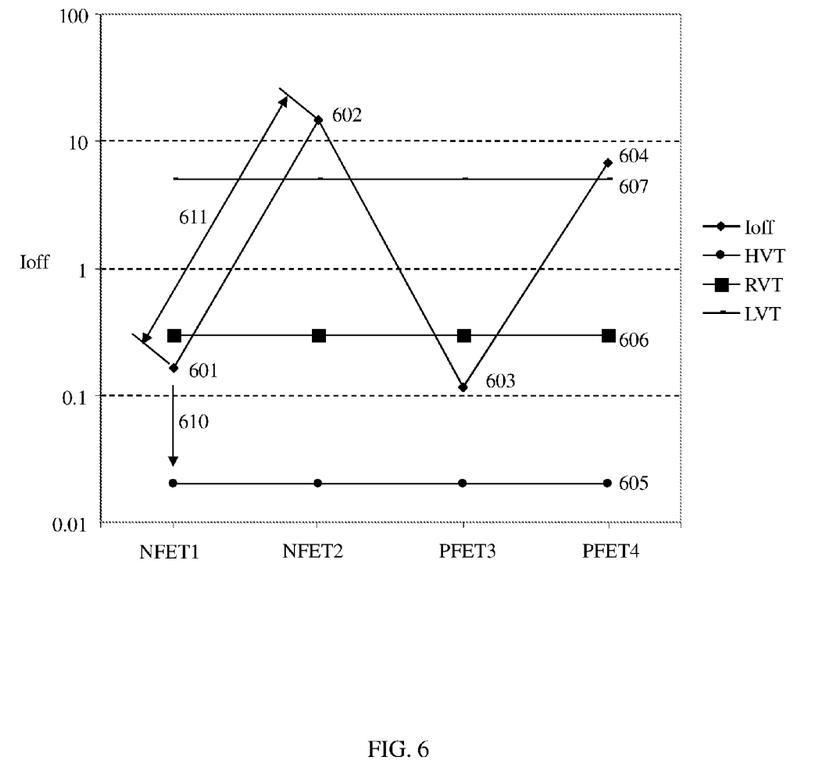
FIGS. 6 and 7 show data plots corresponding to semiconductor structures in accordance with aspects of the invention.

FIG. 6 shows a plot of values 601, 602, 603, 604 of leakage current (Ioff) for a number of transistors (NFET1, NFET2, PFET1, PFET2) formed in accordance with aspects of the invention. FIG. 6 also shows lines 605, 606, 607 that correspond to target values of Ioff for HVT, RVT, and LVT devices. As shown in FIG. 6, the values of Ioff at points 601, 602, 603, 604 are not aligned with the target values at lines 605, 606, 607. According to aspects of the invention, the values of Ioff of the transistors may be adjusted as indicated by arrow 610 by changing the dopant concentration of the bodies of the transistors. According to further aspects of the invention, the delta_Ioff 611 between two points, e.g., 601 and 602, may be adjusted by tailoring the thickness of the BOX layer of the FDSOI device. In this manner, the values of Ioff of the NFETs and PFETs that are formed in accordance with aspects of the invention may be tailored to particular target values by adjusting the transistor body dopant concentration and/or the BOX layer thickness.

Figure 7:
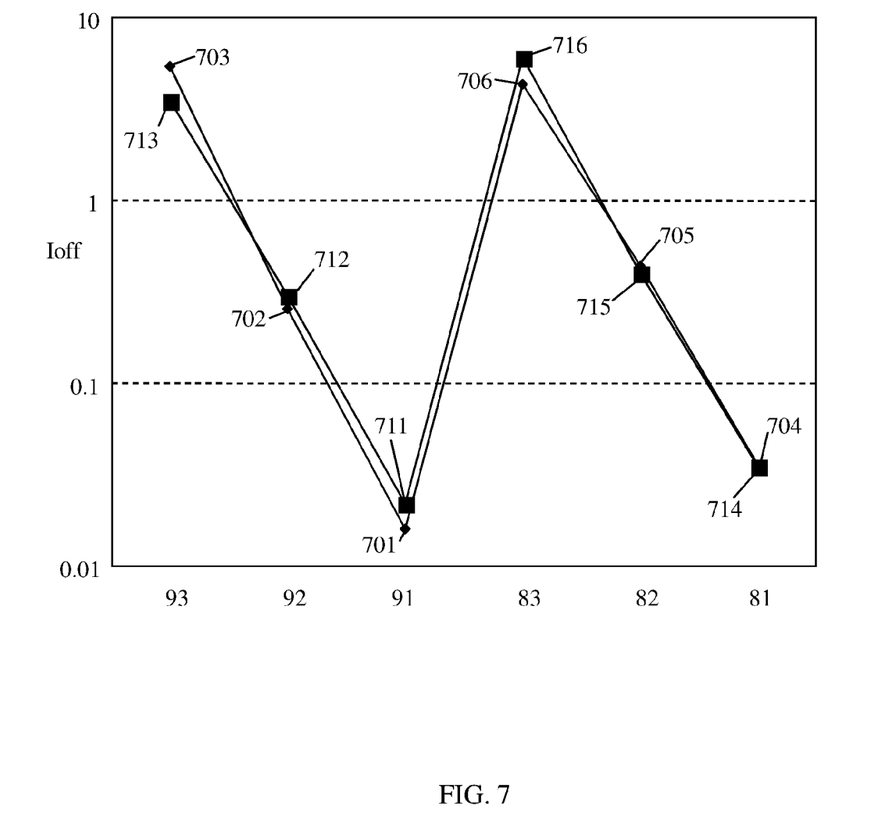

FIG. 7 shows a plot of values 701, 702, 703, 704, 705, 706 of leakage current (Ioff) for a number of transistors formed in accordance with aspects of the invention. Specifically, the values 701-706 correspond to an exemplary implementation of the FETs 81-83 and 91-93 (described with respect to FIGS. 5a-5c) formed using the following parameters: the gate dielectric 101 thickness is about 25 Å; the thickness of each of the transistor bodies 61-63 and 71-73 is about 6 nm; the BOX layer 20 thickness is about 30 nm; the n-well 45 is biased to about 1.1 V; the p-type substrate 10 is biased to about 0 V; the dopant concentration of transistor bodies 61 and 62 is about $6.5 \times 10^{18}/cm^3$; the dopant concentration of transistor body 63 is about $4.3 \times 10^{18}/cm^3$; the dopant concentration of transistor bodies 71 and 72 is about $5.5 \times 10^{18}/cm^3$; the dopant concentration of transistor body 73 is about $3.0 \times 10^{18}/cm^3$; and the gate length of each transistor is about 40 nm. FIG. 7 also shows target Ioff values 711, 712, 713, 714, 715, 716 that correspond to conventional planar transistors formed in a bulk design. In this manner, it is demonstrated that the inventive FDSOI device including HVT/RVT/LVT PFETs formed over an n-well at VDD and HVT/RVT/LVT NFETs formed over an p-type substrate at ground can be tailored to achieve target leakage current (Ioff) values corresponding to conventional bulk designs by selectively adjusting the BOX layer thickness and/or the transistor body dopant concentration.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a first area of the semiconductor structure including an n-well in a p-type substrate;
a second area of the semiconductor structure adjacent the first area including the p-type substrate without the n-well;
a first transistor, a second transistor, and a third transistor each having a different threshold voltage and each being within the first area of the semiconductor structure over the n-well that is biased to a first voltage; and
a fourth transistor, a fifth transistor, and a sixth transistor each having a different threshold voltage and each being within the second area of the semiconductor structure over the p-type substrate that is biased to a second voltage,
wherein the second voltage is different than the first voltage,
the first voltage is a power supply voltage; and
the second voltage is ground.

2. The structure of claim 1, wherein:
the first transistor is a high threshold voltage transistor;
the second transistor is a regular threshold voltage transistor;
the third transistor is a low threshold voltage transistor;
the fourth transistor is a high threshold voltage transistor;
the fifth transistor is a regular threshold voltage transistor; and
the sixth transistor is a low threshold voltage transistor.

3. The structure of claim 2, wherein:
a threshold voltage of the first transistor is a predetermined amount higher than a threshold voltage of the second transistor;
the threshold voltage of the second transistor is the predetermined amount higher than a threshold voltage of the third transistor;
a threshold voltage of the fourth transistor is the predetermined amount higher than a threshold voltage of the fifth transistor; and
the threshold voltage of the fifth transistor is the predetermined amount higher than a threshold voltage of the sixth transistor.

4. The structure of claim 1, wherein:
a transistor body of the first transistor and a transistor body of the second transistor each has a first dopant concentration;
a transistor body of the third transistor has a second dopant concentration that is less than the first dopant concentration;
a transistor body of the fourth transistor and a transistor body of the fifth transistor each has a third dopant concentration; and
a transistor body of the sixth transistor has a fourth dopant concentration that is less than the third dopant concentration.

5. The structure of claim 4, wherein:
the second transistor is over a p-type back gate; and
the fifth transistor is over an n-type back gate.

6. The structure of claim 5, wherein:
the p-type back gate causes a threshold voltage of the second transistor to be less than a threshold voltage of the first transistor; and
the n-type back gate causes a threshold voltage of the fifth transistor to be less than a threshold voltage of the fourth transistor.

7. The structure of claim 5, wherein:
the second dopant concentration being less than the first dopant concentration causes a threshold voltage of the third transistor to be less than a threshold voltage of the second transistor; and
the fourth dopant concentration being less than the third dopant concentration causes a threshold voltage of the sixth transistor to be less than a threshold voltage of the fifth transistor.

8. The structure of claim 1, wherein the n-well is a single n-well in the p-type substrate and is biased using a single n-well contact opening.

9. The structure of claim 8, further comprising a buried oxide (BOX) layer on the p-type substrate, wherein respective transistor bodies of the first transistor, the second transistor, the third transistor, the fourth transistor, the fifth transistor, and the sixth transistor are on the BOX layer.

10. The structure of claim 8, wherein:
the single n-well directly contacts the BOX layer at a location directly underneath the first transistor;
the single n-well directly contacts the BOX layer at a location directly underneath the third transistor;
the p-type substrate directly contacts the BOX layer at a location directly underneath the fourth transistor;
the p-type substrate directly contacts the BOX layer at a location directly underneath the sixth transistor;
the second transistor is over a p-type back gate formed in the single n-well; and
the fifth transistor is over an n-type back gate formed in the p-type substrate.

11. The structure of claim 1, wherein:
the first transistor and the fourth transistor share a first common gate electrode;
the second transistor and the fifth transistor share a second common gate electrode; and
the third transistor and the sixth transistor share a third common gate electrode.

12. A semiconductor structure, comprising:
a substrate including a first area and a second area;
a well in only the first area of the substrate, wherein the well is biased differently than the substrate;
a buried oxide (BOX) layer on the substrate;
a first transistor having a first threshold voltage;
a second transistor having a second threshold voltage less than the first threshold voltage;
a third transistor having a third threshold voltage less than the second threshold voltage;
a fourth transistor having a fourth threshold voltage;
a fifth transistor having a fifth threshold voltage less than the fourth threshold voltage; and a sixth transistor having a sixth threshold voltage less than the fifth threshold voltage, wherein the first transistor, the second transistor, and the third transistor are on the BOX layer and over the well over the first area of the substrate, and the fourth transistor, the fifth transistor, and the sixth transistor are on the BOX layer and over the second area of the substrate, the well is an n-well that is biased to a power supply voltage; and the substrate is a p-type substrate that is biased to ground.

13. The structure of claim 12, wherein:

a transistor body of the first transistor and a transistor body of the second transistor each has a first dopant concentration;

a transistor body of the third transistor has a second dopant concentration that is less than the first dopant concentration;

a transistor body of the fourth transistor and a transistor body of the fifth transistor each has a third dopant concentration; and a transistor body of the sixth transistor has a fourth dopant concentration that is less than the third dopant concentration.

14. The structure of claim 12, wherein:

the substrate is a p-type substrate;

the n-well is a single n-well in the p-type substrate and is biased to a power supply voltage using a single n-well contact opening;

the second transistor is over a p-type back gate formed in the single n-well; and the fifth transistor is over an n-type back gate formed in the p-type substrate.

15. The structure of claim 14, wherein:

the p-type substrate directly contacts the BOX layer at a location directly underneath the fourth transistor; and the p-type substrate directly contacts the BOX layer at a location directly underneath the sixth transistor.

16. A semiconductor structure, comprising:

a substrate including a first area and a second area;

a well in only the first area of the substrate and biased differently than the substrate;

a buried oxide (BOX) layer on the substrate;

a first transistor having a first threshold voltage;

a second transistor having a second threshold voltage less than the first threshold voltage;

a third transistor having a third threshold voltage less than the second threshold voltage;

a fourth transistor having a fourth threshold voltage;

a fifth transistor having a fifth threshold voltage less than the fourth threshold voltage; and a sixth transistor having a sixth threshold voltage less than the fifth threshold voltage, wherein the first transistor, the second transistor, and the third transistor are on the BOX layer and over the well in the first area, the fourth transistor, the fifth transistor, and the sixth transistor are on the BOX layer and over the substrate in the second area, the second transistor is over a p-type back gate; and the fifth transistor is over an n-type back gate.

17. The structure of claim 16, wherein:

the p-type back gate is in the well; and the n-type back gate is in the substrate.

18. The structure of claim 17, wherein:

the substrate is a p-type substrate that is biased to ground; and the well is a single n-well in the p-type substrate and is biased to a power supply voltage using a single n-well contact opening.

19. The structure of claim 18, wherein:

the first transistor and the fourth transistor share a first common gate electrode;

the second transistor and the fifth transistor share a second common gate electrode; and the third transistor and the sixth transistor share a third common gate electrode.

* * * * *